(12) United States Patent
Wang et al.

(10) Patent No.: US 10,157,684 B2
(45) Date of Patent: Dec. 18, 2018

(54) PRECHARGING CIRCUIT, SCANNING DRIVING CIRCUIT, ARRAY SUBSTRATE, AND DISPLAY DEVICE (71) Applicants: BOE TECHNOLOGY GROUP CO., LTD., Beijing (CN); BEIJING BOE DISPLAY TECHNOLOGY CO., LTD., Beijing (CN)

(72) Inventors: Junwei Wang, Beijing (CN); Bin Feng, Beijing (CN)

(73) Assignees: BOE TECHNOLOGY GROUP CO., LTD., Beijing (CN); BEIJING BOE DISPLAY TECHNOLOGY CO., LTD., Beijing (CN)

( * ) Notice: Subject to any disclaimer, the term of this patent is extended or adjusted under 35 U.S.C. 154(b) by 22 days.

(21) Appl. No.: 15/538,007

(22) PCT Filed: Feb. 5, 2016

(86) PCT No.: PCT/CN2016/073633
§ 371 (c)(1),
(2) Date: Jun. 20, 2017

(87) PCT Pub. No.: WO2017/049844
PCT Pub. Date: Mar. 30, 2017

(65) Prior Publication Data
US 2017/0345517 A1 Nov. 30, 2017

(30) Foreign Application Priority Data
Sep. 24, 2015 (CN) .......................... 2015 1 0616050

(51) Int. Cl.
G11C 19/28 (2006.01)
G11C 19/18 (2006.01)

(52) U.S. Cl.
CPC ............ *G11C 19/28* (2013.01); *G11C 19/186* (2013.01); *G11C 19/188* (2013.01); *G09G 2310/0248* (2013.01)

(58) Field of Classification Search
CPC ......... G09G 3/3677; G09G 2310/0251; G09G 2300/0408; G09G 2310/0408; G11C 19/188; G11C 19/28; G11C 19/186
See application file for complete search history.

(56) References Cited

U.S. PATENT DOCUMENTS

2008/0122875 A1 5/2008 Qi
2010/0109995 A1 5/2010 Fang
(Continued)

FOREIGN PATENT DOCUMENTS

CN 101847377 A 9/2010
CN 101963724 A 2/2011
(Continued)

OTHER PUBLICATIONS

The International Search Report and Written Opinion dated Jun. 17, 2016; Appln. No. PCT/CN2016/073633.
(Continued)

*Primary Examiner* — Robert Michaud
(74) *Attorney, Agent, or Firm* — Ladas & Parry LLP; Loren K. Thompson (57) ABSTRACT

A precharging circuit, a scanning driving circuit, an array substrate, and a display device are provided. The precharging circuit includes an input end, an output end, and further includes a switching unit, first pull-up unit, and second pull-up unit. The switching unit has first end connected to first node; second end connected to the input end, and third end connected to second node, and is used for conducting the second end and the third end when first end is at high level; first pull-up unit has first end connected to the output (Continued)

end and second end connected to first node, and is used for pulling up potential of second end when first end is at high level; second pull-up unit has first end connected to second node and second end connected to output end, is used for pulling up potential of second end when first end is at high level.

20 Claims, 4 Drawing Sheets

(56) References Cited

U.S. PATENT DOCUMENTS

| 2010/0245301 A1* | 9/2010 | Shang | G09G 3/3677 |
| | | | 345/204 |
| 2011/0058642 A1* | 3/2011 | Tsai | G09G 3/3677 |
| | | | 377/79 |
| 2014/0160184 A1* | 6/2014 | Wang | G09G 3/3666 |
| | | | 345/691 |

FOREIGN PATENT DOCUMENTS

| CN | 103280201 A | 9/2013 |
| CN | 104464667 A | 3/2015 |
| CN | 105096812 A | 11/2015 |

OTHER PUBLICATIONS

The First Chinese Office Action dated Apr. 21, 2017; Appln. No. 201510616050.7.

* cited by examiner

PRECHARGING CIRCUIT, SCANNING DRIVING CIRCUIT, ARRAY SUBSTRATE, AND DISPLAY DEVICE

TECHNICAL FIELD

The present disclosure relates to a precharging circuit, a scanning driving circuit, an array substrate and a display device.

BACKGROUND

The gate driver on array (GOA) technique, as a new display technique, can remove a part of a scanning driving integrated circuit by integrating the scanning driving circuit on the array substrate, so that materials are saved and process steps are reduced, thereby realizing the purpose of reducing the cost of products. However, current GOA products are mostly applicable to small and medium size products. In the case that a size of a product is relatively large, it would cause a problem that output capability of a scanning driving signal is insufficient. For example, amplitude of the scanning driving signal is too small at a remote position because resistance is too large, or high-frequency display cannot be realized because delay is excessive. In order to improve such problem, the prior art usually increases the maximum amplitude voltage of the scanning driving signal, so as to enhance the amplitude of the scanning driving signal at each position on the whole.

SUMMARY

There is provided in embodiments of the present disclosure a precharging circuit, a scanning driving circuit, an array substrate and a display device.

According to a first aspect of the present disclosure, there is provided a precharging circuit, comprising an input end and an output end, and further comprising a switching unit, a first pull-up unit and a second pull-up unit, wherein:

a first end of the switching unit is connected with a first node, a second end thereof is connected with the input end, and a third end thereof is connected with a second node, and the switching unit is configured to conduct the second end and the third end when the first end is at a high level;

a first end of the first pull-up unit is connected with the output end, a second end thereof is connected with the first node, and the first pull-up unit thereof is configured to pull up a potential at the second end when the first end is at the high level; and a first end of the second pull-up unit is connected with the second node, a second end thereof is connected with the output end, and the second pull-up unit is configured to pull up the potential at the second end when the first end is at the high level.

Optionally, the switching unit comprises a first transistor, whose gate is connected with the first node, one of source and drain is connected with the input end, and the other of the source and the drain is connected with the second node.

Optionally, the first pull-up unit comprises a second transistor, whose gate is connected with the output end, one of source and drain is connected with the output end, and the other of the source and the drain is connected with the first node.

Optionally, the second pull-up unit comprises a third transistor, whose gate is connected with the second node, one of source and drain is connected with the second node, and the other of the source and the drain is connected with the output end.

Optionally, the precharging circuit further comprises a reset sub-circuit; the reset sub-circuit is connected with the first node, and is configured to set a potential at the first node as a low level after the input end is converted from the high level into the low level.

Optionally, the reset sub-circuit comprises a fourth transistor, whose gate is connected with the first node, one of source and drain is connected with the first node, and the other of the source and the drain is connected with the input end.

Optionally, the reset sub-circuit comprises a fifth transistor, whose gate is connected with a start input signal, one of source and drain is connected with the first node, and the other of source and drain is connected with a low level voltage line.

Optionally, the reset sub-circuit further comprises a sixth transistor, whose gate is connected with the start input signal, one of source and drain is connected with the second node, and the other of the source and the drain is connected with the low level voltage line.

There is provided according to a second aspect of the present disclosure a driving method of any one of the precharging circuit as described above, comprising:

in a first phase, pulling up the potential at the input end to the high level, and maintaining the low level at the output end;

in a second phase, maintaining the high potential at the input end, and pulling up the potential at the output end to the high level, so that the first pull-up unit pulls up the potential at the first node, the switching unit conducts the input end and the second node, and the second pull-up unit pulls up the potential at the output end;

in a third phase, setting the potential at the input end as the low level, maintaining the high level of the output end, so that the first pull-up unit pulls up the potential at the first node, and the switching unit conducts the input end and the second node;

in a fourth phase, maintaining the low level of the input end, and setting the potential at the output end as the low level.

There is further provided according to a third aspect of the present disclosure a scanning driving circuit, comprising multiple stages of shift register units; any one of the precharging circuit being disposed between output ends of two adjacent stages of shift register units.

Optionally, the scanning driving circuit particularly comprises: multiple stages of first shift register units driven by a first clock signal and a third clock signal, and multiple stages of second shift register units driven by a second clock signal and a fourth clock signal; input ends and output ends of the multiple stages of first shift register units are connected in series sequentially; input ends and output ends of the multiple stages of second shift register units are connected in series sequentially; any one of the precharging circuit is disposed between an output end of an i-th stage of first shift register unit and an output end of an i-th stage of second shift register unit and between the output end of the i-th stage of second shift register unit and an output end of a (i+1)-th stage of first shift register unit; where i is a positive integer.

Optionally, within one clock period by taking the first clock signal being converted into an effective level as a start, periods of time during which the first clock signal, the second clock signal, the third clock signal and the fourth clock signal are at the effective level lag a predetermined time sequentially; a length of the predetermined time is smaller than a half of the clock period.

There is further provided according to a fourth aspect of the present disclosure an array substrate, comprising any one of the scanning driving circuit as described above.

Optionally, a display region is disposed on the array substrate, the scanning driving circuit is disposed at least one side of the display region, and the precharging circuit is disposed within the display region.

There is further provided according to a fifth aspect of the present disclosure a display device, comprising any one of the array substrate as described above.

According to the above technical solutions, it can be known that the precharging circuit in the embodiments of the present disclosure can utilize a scanning driving signal of one stage to pre-charge a scanning driving signal of a next stage, so that output capability of the scanning driving signal can be raised based on a principle of charge sharing.

DETAILED DESCRIPTION

In order to make principles, technical solutions and advantages of embodiments of the present disclosure more clear, descriptions will be given below more clearly and completely by combining with figures. Obviously, the embodiments described below are just a part of embodiments of the present disclosure and not all of the embodiments.

Figure 1:
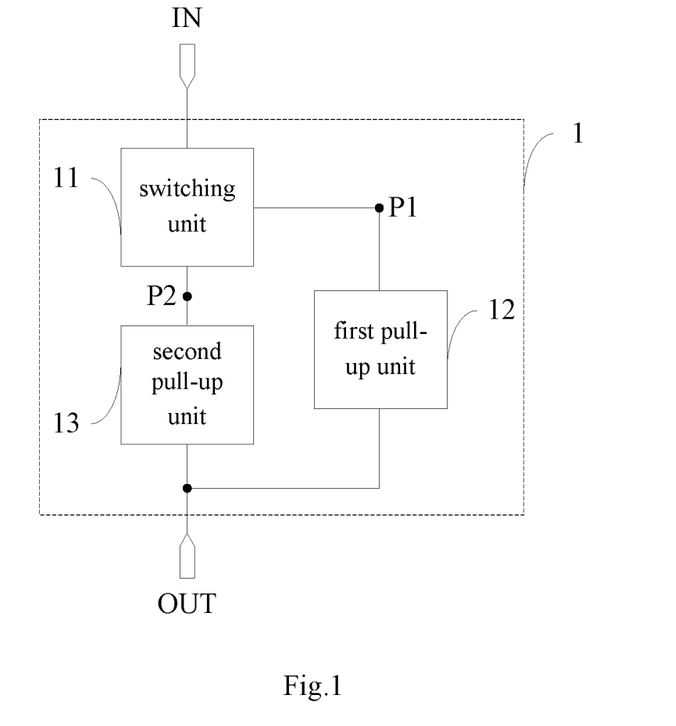
FIG. 1 is a schematic structure block diagram of a precharging circuit in an embodiment of the present disclosure.

FIG. 1 is a schematic structure block diagram of a precharging circuit in an embodiment of the present disclosure. Referring to FIG. 1, the precharging circuit 1 comprises an input end IN and an output end OUT, and further comprises a switching unit 11, a first pull-up unit 12 and a second pull-up unit 13.

In FIG. 1, a first end of the switching unit 11 is connected with a first node P1, a second end thereof is connected with an input end IN, and a third end thereof is connected with a second node P2. The switching unit 11 is configured to conduct the second end and the third end when the first end is at a high level;

A first end of the first pull-up unit 12 is connected with the output end OUT, a second end thereof is connected the first node P1. The first pull-up unit 12 is configured to pull up a potential at the second end when the first end is at the high level;

A first end of the second pull-up unit 13 is connected with a second node P2, a second end thereof is connected with the output end OUT. The second pull-up unit 13 is configured to pull up the potential at the second end when the first end is at the high level.

It should be noted that "high level" and "low level" in the text refer to two logic statuses represented by a range of potential height at a position of a certain circuit node respectively. For example, the high level at the first node P1 and the second node P2 can particularly refer to a potential higher than a common end voltage, and the low level at the first node P1 and the second node P2 can particularly refer to a potential lower than the common end voltage. The high level at the input end IN and the output end OUT can particularly refer to a potential having 6V more than the common end voltage, and the low level at the input end IN and the output end OUT can particularly refer to a potential having 6V less than the common end voltage. It can be understood that the specific potential height scope can be set according to requirements under specific application scenarios, to which the present disclosure does not limit.

Correspondingly, "pull-up" in the text means making a level at a node of a corresponding circuit raise to the high level, and "pull-down" in the text means making the level at the node of the corresponding circuit decrease to the low level. It can be understood that both the "pull-up" and "pull-down" can be implemented by directional flow of electric charges, and thus can be realized by means of electronic element devices having the corresponding function or combination thereof, to which no further limitation is made.

In order to describe structures and functions of respective units more clearly, operation principle of the precharging circuit 1 will be described briefly.

Referring to FIG. 1, in a general status, both the input end IN and the output end OUT are connected with the low level, and both the first node P1 and the second node P2 inside the precharging circuit 1 are at the low level, so that the switching unit 11, the first pull-up unit 13, and the second pull-up unit 13 do not operate, and potentials of respective nodes maintain unchanged.

At this time, if the potential at the input end IN starts to raise from the low level, then in the process of the potential at the input end IN starting raising from the low level to the high level, potentials of the first node P1, the second node P2 and the output end OUT still maintain unchanged because the switching unit 11, the first pull-up unit 13, and the second pull-up unit 13 still maintain previous operation statuses.

In the process that the potential at the input end IN has raised to the high level and maintains at the high level, and the output end starts to raise from the low level to the high level, the first pull-up unit 12 can pull up the potential at the first node P1 under the effect of the high level of the output end OUT, so that the potential at the first node P1 reaches the high level quickly (the high level at the first node P1 is lower than the high level at the output end OUT). At this time, the switching unit 11 conducts the input end IN and the second node P2 under the effect of the high level at the first node P1, so that the high level at the input end IN pulls up the potential at the second node P2. Thus, under the effect of the high level at the second node P2, the second pull-up unit 13 can in turn pull up the potential at the output end OUT, to form a positive feedback of raising of the potential at the output end OUT and speed up the raising of the potential at the output end OUT.

After that, during the period that the output end OUT has raised to the high level and maintains at the high level, the first node P1 would maintain at the high level under the effect of the first pull-up unit 12, so that the switching unit 11 maintains conduction between the input end IN and the second node P2. At this time, if the potential at the input end IN converts from the high level into the low level, then the potential at the second node P2 would decrease as the potential at the input end IN decreases, and finally decrease to the low level. After that, if the potential at the output end OUT also converts from the high level into the low level, then the process of speeding up the raising of the potential at the output end OUT can be repeated when the potential at the input end IN rises again and maintains at the high level.

It can be seen that when the input end IN and the output end OUT of the precharging circuit 1 are connected to two scanning driving signals crossed in a high level phase respectively, one scanning driving signal can be utilized to pre-charge another scanning driving signal, so that output capability of the scanning driving signal can be raised based on a principle of charge sharing. Compared with the prior art, since the embodiment of the present disclosure can reduce the requirement for the maximum amplitude voltage of the scanning driving signal, power consumption of the scanning driving circuit can be reduced while the output capability of the scanning driving signal is ensured, which is advantageous for improving the product performance.

Figure 2:
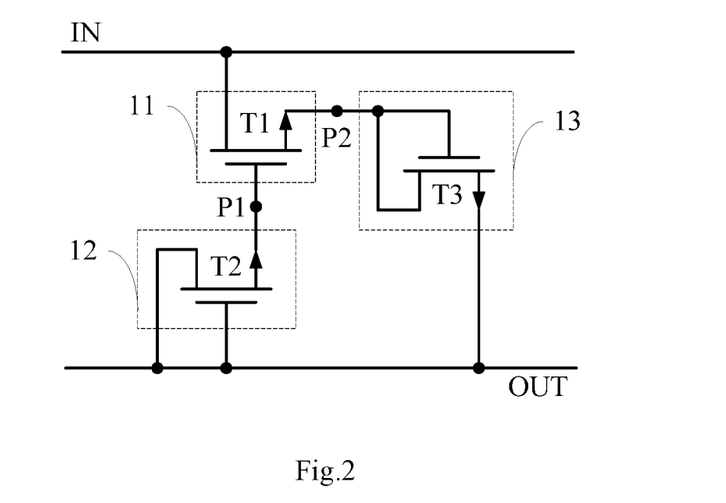
FIG. 2 is a schematic diagram of a circuit structure of a precharging circuit in an embodiment of the present disclosure.

As a more particular example, FIG. 2 is a schematic diagram of a circuit structure of a precharging circuit in an embodiment of the present disclosure.

Referring to FIG. 2, in an embodiment of the present disclosure, the switching unit 11 can comprise a first transistor T1. A gate of the first transistor T1 is connected to the first node P1, one of a source and a drain thereof is connected to the input end IN, and the other of the source and the drain thereof is connected to the second node P2. Alternatively, the first transistor T1 in FIG. 1 is an N type transistor, and thus an end connected to the second node P2 is the source, and an end connected to the input end IN is the drain. It can be seen that when the first node P1 is at the high level, current can be conducted between the source and the drain inside the first transistor T1, so that functions of the switching unit 11 can be realized, and the switching unit can be integrated with the existing GOA process, so as to reduce the manufacturing cost.

In the embodiment as shown in FIG. 2, the first pull-up unit 12 comprises a second transistor T2. A gate of the second transistor T2 is connected to the output end OUT, one of a source and a drain thereof is connected to the output end OUT, and the other of the source and the drain thereof is connected to the first node P1. Alternatively, the second transistor T2 in FIG. 1 is an N type transistor, and thereby an end connected to the first node P1 is the source, and an end connected to the output end OUT is the drain. It can be seen that when the output end OUT is at the high level, current can be conducted between the source and the drain inside the second transistor T2 and pull-up of the potential at the first node P1 is realized, so that functions of the first pull-up unit 12 can be realized, and the first pull-up unit 12 can be integrated with the existing GOA process, so as to reduce the manufacturing cost.

In the embodiment as shown in FIG. 2, the second pull-up unit 13 comprises a third transistor T3. A gate of the third transistor T3 is connected to the second node P2, one of a source and a drain thereof is connected to the second node P2, and the other of the source and the drain thereof is connected to the output end OUT. Alternatively, the third transistor T3 in FIG. 1 is an N type transistor, and thereby an end connected to the output end OUT is the source, and an end connected to the second node P2 is the drain. It can be seen that when the second node P2 is at the high level, current can be conducted between the source and the drain inside the third transistor T3, and pull-up of the potential at the output end OUT can be realized, so that functions of the second pull-up unit 13 can be realized, and the second pull-up unit 13 can be integrated with the existing GOA process, so as to reduce the manufacturing cost.

However, in the precharging circuit, if a coupling capacitance at the first node is too large, then the potential at the first node would be maintained at the high level within a period of time after the potential at the output end converts from the low level into the high level and then converts from the high level into the low level, such that the precharging circuit cannot restore to a general status, and thus it is likely to influence operation process of a next time (for example, within a next display frame after one display frame).

In order to solve this problem, a reset sub-circuit connected with the first node P1 can be added on the basis of any one of the above precharging circuits. The reset sub-circuit is configured to set the potential at the first node P1 to the low level after the input end IN converts from the high level into the low level.

Figure 3:
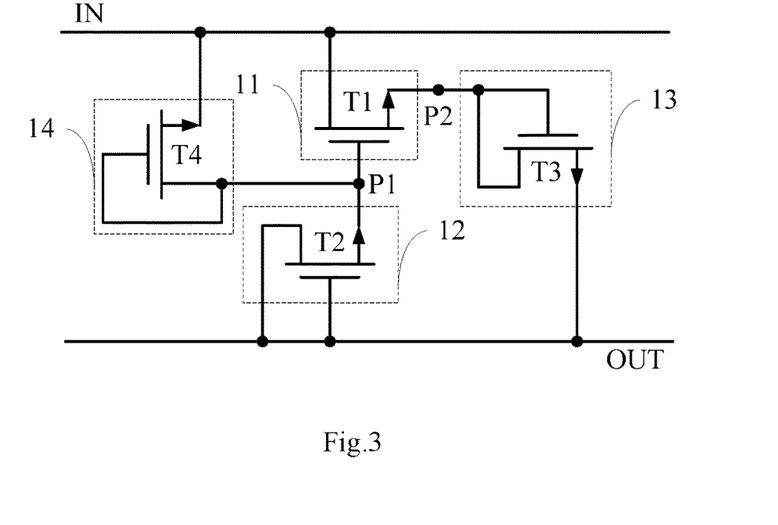
FIG. 3 is a schematic diagram of a circuit structure of a precharging circuit in another embodiment of the present disclosure.

For example, FIG. 3 is a schematic diagram of a circuit structure of a precharging circuit in another embodiment of the present disclosure. It can be seen that the precharging circuit as shown in FIG. 3 is added a reset sub-circuit 14 comprising a fourth transistor T4 on the basis of the circuit structure as shown in FIG. 2. A gate of the fourth transistor T4 is connected to the first node P1, one of a source and a drain thereof is also connected to the first node P1, and the other of the source and the drain thereof is connected to the input end IN. Then, when the first node P1 is at the high level, current can be conducted between the source and the drain inside the fourth transistor T4, and thereby the potential at the first node P1 can be set at the low level when the input end IN is at the low level, so that functions of the reset unit 14 can be realized, and the reset unit 14 can be integrated with the existing GOA process, so as to reduce the manufacturing cost.

Figure 4:
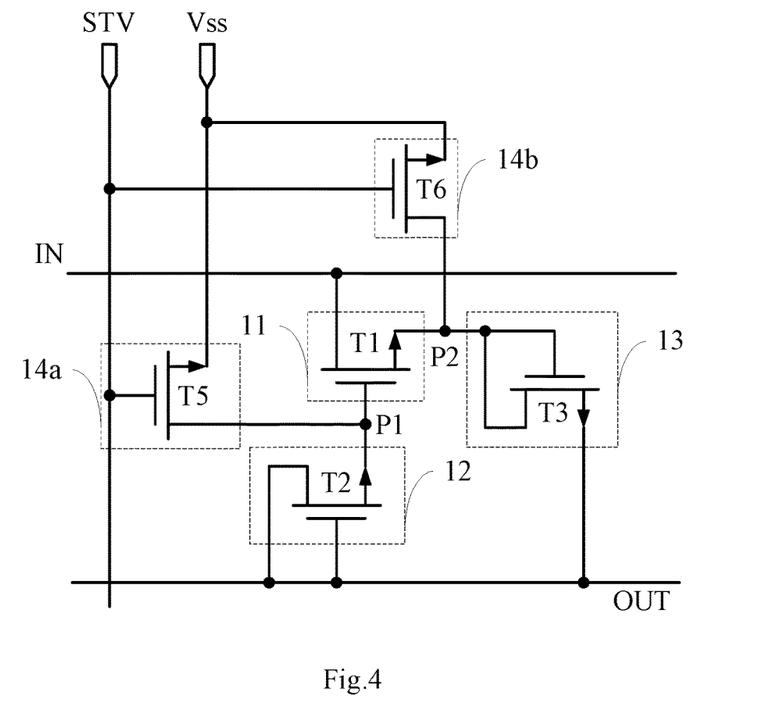
FIG. 4 is a schematic diagram of a circuit structure of a precharging circuit in yet another embodiment of the present disclosure.

As another example, FIG. 4 is a schematic diagram of a circuit structure of a precharging circuit in yet another embodiment of the present disclosure. It can be seen that the precharging circuit as shown in FIG. 4 is added a reset sub-circuit 14 (the reset sub-circuit as shown in the figure is composed of two parts, i.e., 14a and 14b) comprising a fifth transistor T5 and a sixth transistor T6 on the basis of the circuit structure as shown in FIG. 2. In FIG. 4, a gate of the fifth transistor T5 is connected to a start input signal STV (in particular, it is a control signal at an effective level within at least a part of time between a time of returning to a general status and a time of the potential at the input end starting to raise, and it can particularly be an input signal of the first stage of shift register unit when being applied to the scanning driving circuit), one of a source and a drain thereof is connected to the first node P1, and the other of the source and the drain thereof is connected to the low level voltage line Vss. Then, when the start input signal STV is at the effective level, current can be conducted between the source and the drain inside the fifth transistor T5, so that the first node P1 can be set at the low level by the low level voltage line Vss, and functions of the reset unit 14 are realized.

Additionally, a gate of the sixth transistor T6 is connected to the start input signal STV, one of a source and a drain thereof is connected to the second node P2, and the other of the source and the drain thereof is connected to the low level voltage line Vss. Therefore, the potential at the second node P2 can be set at the low level through a similar process, so that resetting the potential at the second node P2 is realized, and stability of operation of the precharging circuit is enhanced. It could be understood that when any one of transistors in the embodiment of the present disclosure has a structure where a source and a drain are symmetrical, the source and the drain can be taken as two electrodes to which no special distinction is made. In specific implementation, types of transistors can be selected according to the requirement for application.

Figure 5:
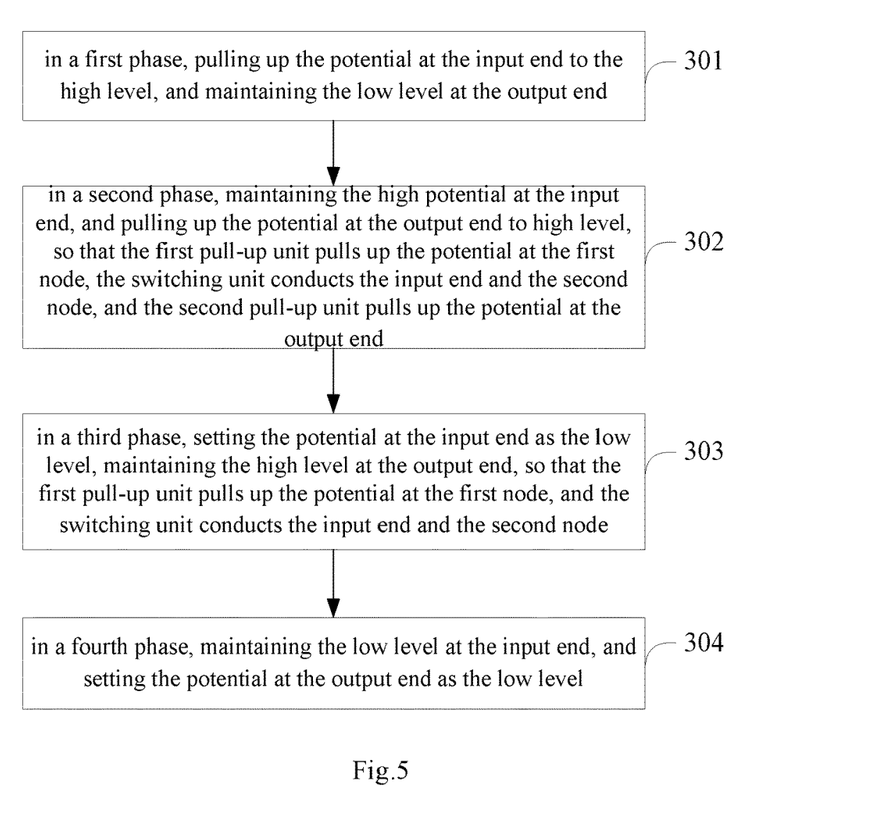
FIG. 5 is a schematic diagram of step flows of a driving method of a precharging circuit in an embodiment of the present disclosure.

Based on a same inventive concept, FIG. 5 is a schematic diagram of step flows of a precharging circuit in an embodiment of the present disclosure. Referring to FIG. 5, the method comprises following steps:

Step 301: in a first phase, pulling up the potential at the input end to the high level, and maintaining the low level at the output end;

Step 302: in a second phase, maintaining the high level at the input end, and pulling up the potential at the output end to the high level, so that the first pull-up unit pulls up the potential at the first node, the switching unit conducts the input end and the second node, and the second pull-up unit pulls up the potential at the output end;

Step 303: in a third phase, setting the potential at the input end as the low level, and maintaining the high level at the output end, so that the first pull-up unit pulls up the potential at the first node, and the switching unit conducts the input end and the second node;

Step 304: in a fourth phase, maintaining the low level at the input end, and setting the potential at the output end to the low level.

Figure 6:
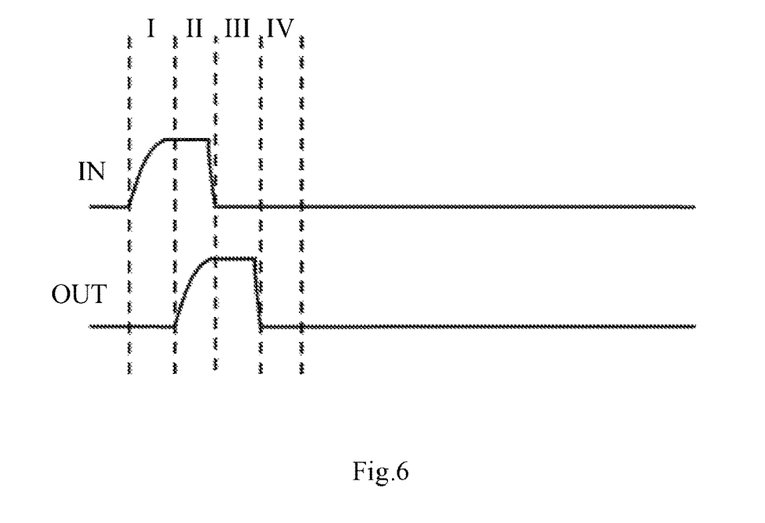
FIG. 6 is a circuit timing diagram of a precharging circuit in an embodiment of the present disclosure.

Being consistent with the step flows as shown in FIG. 5 as well as the operation principle of the precharging circuit 1 as described above, FIG. 6 is a circuit timing diagram of a precharging circuit in an embodiment of the present disclosure. By taking the precharging circuit as shown in FIG. 2 as an example, step flows as shown in FIG. 5 and the circuit timing as shown in FIG. 6 will be described below in detail:

In a first phase I, the potential at the input end IN is pulled up to the high level in step 301, and at the same time the low level at the output end OUT is maintained, so that the first transistor T1, the second transistor T2, and the third transistor T3 are in a turn-off status, and potentials at both the first node P1 and the second node P2 are maintained at the low level.

In a second phase II, the high potential at the input end IN is maintained in step 302, and the potential at the output end OUT is pulled up to the high level, so that the second transistor T2 is turned on after the potential at the output end OUT starts to raise, and the potential at the first node P1 is pulled up; after the potential at the first node P1 raises, the first transistor T1 is turned on while the input end IN pulls up the potential at the second node P2; after the potential at the second node P2 raises, the third transistor T3 is turned on and the potential at the output end OUT is pulled up, to form a positive feedback and speed up the raising of the potential at the output end OUT.

In a third phase III, the potential at the input end IN is set to the low level in step 303, and the high level of the output end OUT is maintained, so that the second transistor T2 maintains turned on under the effect of the high potential at the output end OUT, and the potential at the first node P1 is maintained at the high level; the potential at the second node P2 is pulled down by the turned-on first transistor T1, so that the third transistor T3 is turned off.

In a fourth phase IV, the low level of the input end IN is maintained in step 304, and the potential at the output end OUT is set to the low level. Within the later time including the fourth phase IV, the second transistor T2 and the third transistor T3 maintains turned off, while the high level at the first node P1 would decrease to the low level gradually under the effect of the coupling capacitance, such that the first transistor T1 converts from turned-on into turned-off (or in a flowing state). However, when the precharging circuit comprises any one of the above reset sub-circuits 14, the potential at the first node P1 can return to the low level in a general status, so that when the steps 301 to 304 are executed continuously after that, the precharging circuit can again repeat operation process in the first to fourth phases.

Based on a same inventive concept, there is provided in an embodiment of the present disclosure a scanning driving circuit, comprising multiple stages of shift register units; any one of the precharging circuits is disposed between the output ends of two adjacent stages of shift register units. It can be seen that the precharging circuit of the embodiments of the present disclosure can utilize a scanning driving signal of one stage to pre-charge a scanning driving signal of a next stage, so that output capability of the scanning driving signal can be raised based on a principle of charge sharing. Compared with the prior art, since the embodiment of the present disclosure can reduce the requirement for the maximum amplitude voltage of the scanning driving signal, power consumption of the scanning driving circuit can be reduced while the output capability of the scanning driving signal is ensured, which is advantageous for product performance improvement.

For example, the multiple stages of shift register units whose input ends and output ends are connected in series sequentially and both include a reset end can be connected in cascades in the following manner: except for a first stage of shift register unit, an input end of any stage of shift register units is connected with an output end of a previous stage of shift register units; except for the first stage of shift register units, an output end of any stage of shift register units is connected with a reset end of a previous stage of shift register units.

Figure 7:
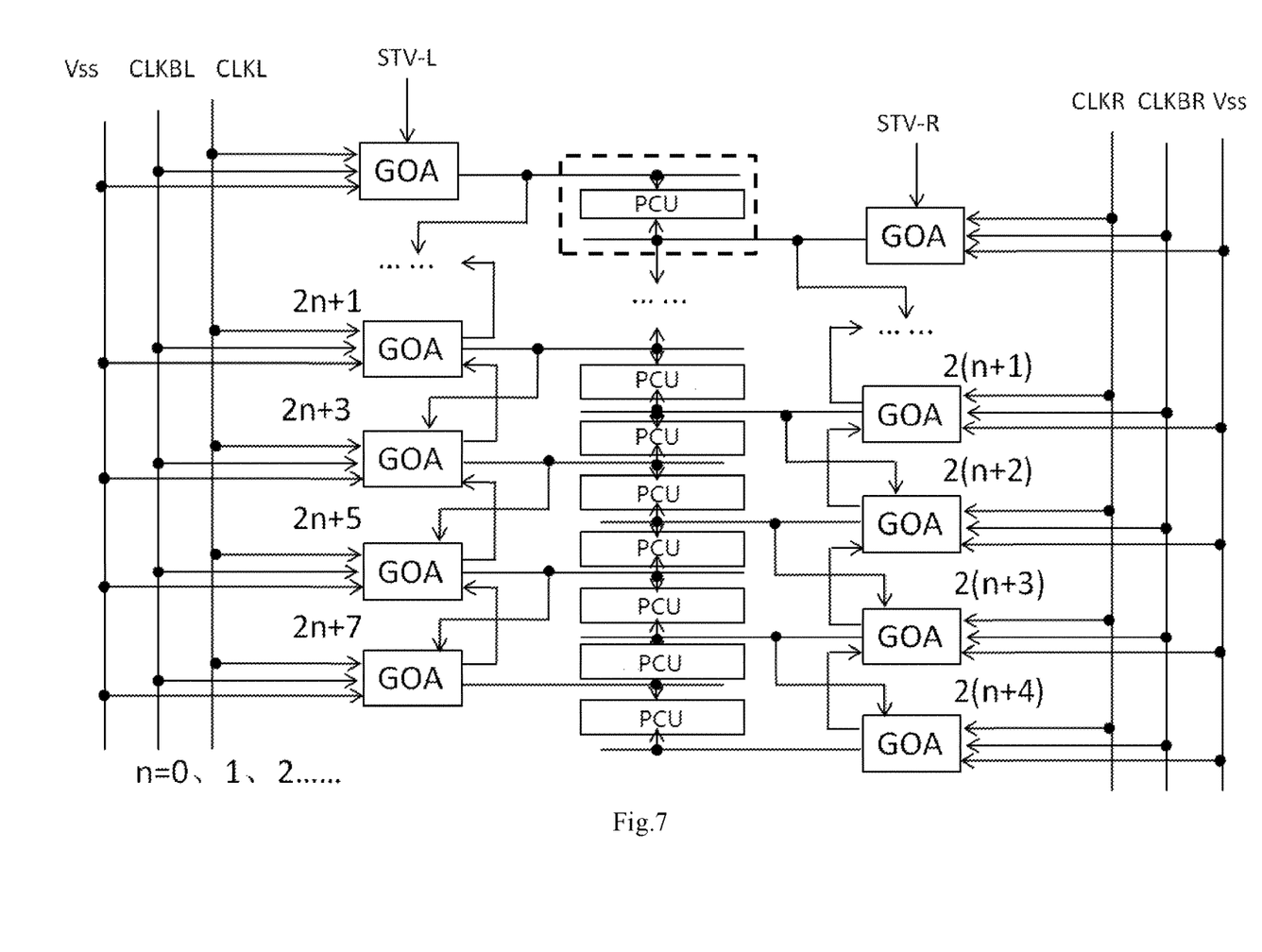
FIG. 7 is a structure schematic diagram of a scanning driving circuit in an embodiment of the present disclosure.

As another example, FIG. 7 is a structure schematic diagram of a scanning driving circuit in an embodiment of the present disclosure. Referring to FIG. 7, the scanning driving circuits in the embodiment are, respectively, first shift registers GOA of odd-numbered stages whose stage numbers are for example 2n+1, 2n+3, 2n+5, 2n+7, and second shift register units GOA of even-numbered stages whose stage numbers are for example 2(n+1), 2(n+2), 2(n+3), 2(n+4), where n is a non-negative integer, for example, 0, 1, 2, . . . , etc. Thus, all the odd-numbered stages of first shift register units are connected in cascades sequentially in the above manner, are connected with the first clock signal CLKL and the third clock signal CLKLB, and are driven by the two clock signals; all the even-numbered stages of second shift register units are connected cascades sequentially in the above manner, are connected with the second clock signal CLKR and the fourth clock signal CLKRB, and are driven by the two clock signal. Additionally, an input end of a first odd-numbered stage of first shift register unit is connected with a start signal STV-L of an odd-numbered stage, an input end of a first even-numbered stage of second shift register unit is connected to a start signal STV-R of an even-numbered stage, and all of the first shift register units and all of the second shift register units are connected to a same low level bias voltage Vss.

For any positive integer i, a pre-charge unit PCU is disposed between an output end of an i-th stage of first shift register and an output end of an i-th stage of second shift register unit and between the output end of the i-th stage of second shift register and an output end of a (i+1)-th stage of first shift register unit, while the pre-charge unit PCU can have the structure of any one of the precharging circuits as described above. Thus, under the effect of the pre-charge unit PCU, an output end of any stage of shift register unit except for the first stage of shift register unit can be pre-charged by the high level of the output end of the previous stage of shift register unit in a phase that the potential raises gradually, so that the output capability of the scanning driving signal is enhanced based on the principle of charge sharing.

Optionally, within one clock period by taking the time that the first clock signal CLKL converts from the ineffective level into the effective level as a start, the periods of time during which the first clock signal CLKL, the second clock signal CLKR, the third clock signal CLKLB and the fourth clock signal CLKRB are at the effective level are prolonged a predetermined time sequentially; a length of the predetermined time is smaller than a half of the clock period. On such a basis, both the input end and the output end of any pre-charge unit PCU can satisfy the condition that maintenance time of the high level is at least partially overlapped.

Based on a same inventive concept, there is provided in an embodiment of the present disclosure an array substrate comprising any one of the scanning driving circuits, and thus has advantages of any one of the scanning driving circuit as described above. Herein, there can be disposed on the array substrate a display region, and the scanning driving circuit is disposed on at least one side outside of the display region, so as to form the array substrate under the GOA structure. Further, the precharging circuit can be disposed within the display region, and is manufactured and formed by adopting the same process as transistors in the display region.

Based on a same inventive concept, there is provided in an embodiment of the present disclosure a display device. The display device comprises any one of the array substrates as described above, and thus has the advantages of any one of the array substrates as described above. It should be noted that the display device in the embodiment can be any product or means having a display function, such as an electronic paper, a mobile phone, a tablet computer, a television set, a notebook computer, a digital phone frame, a navigator, or the like.

It should be noted in the description of the present disclosure that orientation or position relationship indicated by "up" and "down" and so on is based on the orientation or position relationship as shown in the figures, are used to describe the present disclosure and simplify the description, instead of indicating or suggesting that the referred apparatus or element must have a specific orientation and be constructed and operated with the specific orientation, and thus it is unable to be understood as a limitation to the present disclosure. Except where expressly stated otherwise, terms of "install", "connect" shall be understood broadly, for example, connection may be fixed connection, or may be dismountable connection, or integral connection; may be mechanical connection, or may be electrical connection; may be direct connection, or may be indirect connection through a medium media, or connection inside two elements. For those ordinary skilled in the art, specific meanings of the above terms in the present disclosure can be understood according to the specific scenario.

In the description of the present disclosure, a large quantity of specific details is described. However, it can be understood that the embodiments of the present disclosure can be applied without these specific details. In some examples, commonly-known methods, structures and technologies are not shown in detail, so as to not blue the understanding of the present description.

Similarly, it shall be understood that in order to simplify the present disclosure and help understanding one or more of respective aspects of the present disclosure, in the description of exemplary embodiments of the present disclosure, respective characteristics of the present disclosure are sometimes grouped into a single embodiment, figure or description about the figure together. However, the method of the present disclosure shall not be explained as reflecting the following intention: the technical solutions sought for protection in the present disclosure claim more features than the number of features as recited explicitly in each of the claims. More accurately, as reflected in the Claims, inventive aspects lie in being less than all the features of a single embodiment previously disclosed. Therefore, the Claims following a specific implementation is thus explicitly incorporated into the specific implementation, wherein each claim per se is taken as a single embodiment of the present disclosure.

It shall be noted that the above embodiments describe the present disclosure but not limit the present disclosure, and those skilled in the art can design alternative embodiments without departing from the scope of the claims. A word "include/comprise" does not exclude that there exist elements or steps not listed in the claims. Words "an" or "one" modifying an element does not exclude that there exists a plurality of such elements. The present disclosure can be implemented by means of hardware including several different elements and by means of an appropriate programmed computer. In a unit claim listing several devices, several of these devices can be specifically reflected by a same hardware item. The use of words "first", "second", and "third" and so on do not indicate any sequence. These words can be explained as names.

Finally, it shall be described that the above respective embodiments are just used to describe the technical solutions of the present disclosure instead of limiting the present disclosure. Although the embodiments of the present disclosure have been described in detail referring to previous respective embodiments, those ordinary skilled in the art shall understand that he/she can still amend the technical solutions recited in the previous embodiments, or equivalently replace a part or all of the technical features; and these amendments or replacements do not make substance of corresponding technical solutions depart from the scope of the technical solutions of respective embodiments of the present disclosure, and thus should be covered into the scope of the specification and Claims of the present disclosure.

The present application claims the priority of a Chinese patent application No. 201510616050.7 filed on Sep. 24, 2015. Herein, the content disclosed by the Chinese patent application is incorporated in full by reference as a part of the present disclosure.

What is claimed is:

1. A precharging circuit, comprising an input end and an output end, and further comprising a switching unit, a first pull-up unit and a second pull-up unit, wherein:
the switching unit has a first end connected to a first node, a second end connected to the input end, and a third end connected to a second node, and is configured to conduct the second end and the third end when the first end is at a high level;

the first pull-up unit has a first end connected to the output end, a second end connected to the switching unit through the first node, and is configured to pull up a potential of the second end when the first end is at the high level; and the second pull-up unit has a first end connected to the switching unit through the second node, a second end connected to the output end, and is configured to pull up the potential of the second end when the first end is at the high level.

2. The precharging circuit according to claim 1, wherein the switching unit comprises a first transistor, whose gate is connected to the first node, one of source and drain is connected to the input end, and the other of the source and the drain is connected to the second node.

3. The precharging circuit according to claim 1, wherein the first pull-up unit comprises a second transistor, whose gate is connected to the output end, one of source and drain is connected to the output end, and the other of the source and the drain is connected to the first node.

4. The precharging circuit according to claim 1, wherein the second pull-up unit comprises a third transistor, whose gate is connected to the second node, one of source and drain is connected to the second node, and the other of the source and the drain is connected to the output end.

5. The precharging circuit according to claim 1, wherein the precharging circuit further comprises a reset sub-circuit; the reset sub-circuit is connected to the first node, and is configured to set a potential at the first node as the low level after the input end is converted from the high level into the low level.

6. The precharging circuit according to claim 5, wherein the reset sub-circuit comprises a fourth transistor, whose gate is connected to the first node, one of source and drain is connected to the first node, and the other of the source and the drain is connected to the input end.

7. The precharging circuit according to claim 5, wherein the reset sub-circuit comprises a fifth transistor, whose gate is connected to a start input signal, one of source and drain is connected to the first node, and the other of the source and the drain is connected to a low level voltage line.

8. The precharging circuit according to claim 7, wherein the reset sub-circuit further comprises a sixth transistor, whose gate is connected to the start input signal, one of source and drain is connected to the second node, and the other of the source and the drain is connected to the low level voltage line.

9. The precharging circuit according to claim 5, wherein the switching unit comprises a first transistor, whose gate is connected to the first node, one of source and drain is connected to the input end, and the other of the source and the drain is connected to the second node.

10. The precharging circuit according to claim 5, wherein the first pull-up unit comprises a second transistor, whose gate is connected to the output end, one of source and drain is connected to the output end, and the other of the source and the drain is connected to the first node.

11. The precharging circuit according to claim 5, wherein the second pull-up unit comprises a third transistor, whose gate is connected to the second node, one of source and drain is connected to the second node, and the other of the source and the drain is connected to the output end.

12. A method of using the precharging circuit according to claim 1, comprising:

pulling up the potential at the input end to the high level, and maintaining the low level at the output end, in a first phase;

maintaining the high potential at the input end, and pulling up the potential at the output end to high level, so that the first pull-up unit pulls up the potential at the first node, the switching unit conducts the input end and the second node, and the second pull-up unit pulls up the potential at the output end, in a second phase;

setting the potential at the input end as the low level, maintaining the high level at the output end, so that the first pull-up unit pulls up the potential at the first node, and the switching unit conducts the input end and the second node, in a third phase; and maintaining the low level at the input end, and setting the potential at the output end as the low level, in a fourth phase.

13. A scanning driving circuit, comprising multiple stages of shift register units; the precharging circuit according to claim 1 being disposed between output ends of two adjacent stages of shift register units.

14. The scanning driving circuit according to claim 13, wherein the scanning driving circuit comprises: multiple stages of first shift register units driven by a first clock signal and a third clock signal, and multiple stages of second shift register units driven by a second clock signal and a fourth clock signal; input ends and output ends of the multiple stages of first shift register units are connected in series sequentially; input ends and output ends of the multiple stages of second shift register units are connected in series sequentially; any one of the precharging circuit according to claims 1 to 8 is disposed between an output end of an i-th stage of first shift register unit and an output end of an i-th stage of second shift register unit and between the output end of the i-th stage of second shift register unit and an output end of a (i+1)-th stage of first shift register unit; where i is a positive integer.

15. The scanning driving circuit according to claim 14, wherein within one clock period by taking the first clock signal being converted into an effective level as a start, periods of time during which the first clock signal, the second clock signal, the third clock signal and the fourth clock signal are at the effective level lag a predetermined time sequentially; and a length of the predetermined time is smaller than a half of the clock period.

16. An array substrate, comprising the scanning driving circuit according to claim 13.

17. The array substrate according to claim 16, wherein a display region is disposed on the array substrate, the scanning driving circuit is disposed at least one side of the display region, and the precharging circuit is disposed within the display region.

18. A display device, comprising the array substrate according to claim 16.

19. The array substrate according to claim 16, wherein the scanning driving circuit comprises: multiple stages of first shift register units driven by a first clock signal and a third clock signal, and multiple stages of second shift register units driven by a second clock signal and a fourth clock signal; input ends and output ends of the multiple stages of first shift register units are connected in series sequentially; input ends and output ends of the multiple stages of second shift register units are connected in series sequentially; any one of the precharging circuit according to claims 1 to 8 is disposed between an output end of an i-th stage of first shift register unit and an output end of an i-th stage of second shift register unit and between the output end of the i-th stage of second shift register unit and an output end of a (i+1)-th stage of first shift register unit; where i is a positive integer.

20. The array substrate according to claim 19, wherein within one clock period by taking the first clock signal being converted into an effective level as a start, periods of time during which the first clock signal, the second clock signal, the third clock signal and the fourth clock signal are at the effective level lag a predetermined time sequentially; and a length of the predetermined time is smaller than a half of the clock period.

* * * * *